(12) United States Patent
Pascual et al.

(10) Patent No.: US 6,473,457 B1
(45) Date of Patent: Oct. 29, 2002

(54) METHOD AND APPARATUS FOR PRODUCING A PULSE WIDTH MODULATED SIGNAL

(75) Inventors: Cesar Pascual, Urbana, IL (US); William J. Roeckner, Carpentersville, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/307,453

(22) Filed: May 7, 1999

(51) Int. Cl.[7] .................................................. H03K 9/08
(52) U.S. Cl. ........................ 375/238; 332/109; 370/212
(58) Field of Search ...................... 375/238; 332/109; 329/26, 31; 370/212

(56) References Cited

U.S. PATENT DOCUMENTS 6,107,876 A * 8/2000 O'Brien ....................... 330/10

FOREIGN PATENT DOCUMENTS

| WO | WO 92/11699 | 7/1992 | ............ H03M/1/82 |
| WO | WO 92/15153 | 9/1992 | ............ H03M/1/82 |
| WO | WO 97/37433 | 10/1997 | ............ H03M/5/08 |

* cited by examiner

*Primary Examiner*—Stephen Chin
*Assistant Examiner*—Kevin Kim

(57) ABSTRACT

A method and apparatus to produce a pulse width modulated (PWM) signal from pulse code modulated (PCM) data. In one embodiment, a crossing point of an analog signal with the ramp portion of a sawtooth waveform is approximated by first extrapolating, or projecting, a line between two adjacent sample points across other sample points to produce an estimate of the crossing point. A magnitude difference between a crossing point of the extrapolated line and a sample point magnitude on each side of the crossing point is determined. The magnitude difference, multiplied by an empirically determined constant, is added to the estimate. A PWM signal is then produced using the estimate for the crossing point.

22 Claims, 3 Drawing Sheets

METHOD AND APPARATUS FOR PRODUCING A PULSE WIDTH MODULATED SIGNAL

FIELD OF THE INVENTION

This invention relates generally to pulse width modulation, and more specifically to converting a pulse code modulated data stream to a pulse width modulated signal.

BACKGROUND OF THE INVENTION

A potentially useful operation in signal processing, such as digital signal processing of audio signals, is converting a digital pulse code modulated (PCM) data stream into a pulse width modulated (PWM) signal. The pulse code modulated data stream may be received from various sources, such as from a compact disk player or from a multi-media device. The resulting pulse width modulated signal may be applied to a switching amplifier to provide an amplified signal to a load, such as an audio speaker. A switching amplifier driven by a pulse width modulated signal has high efficiency and would therefore be desirable for many commercial applications. However, many conventional PCM to PWM converters introduce a high degree of harmonic distortion into the resulting output signal. One method that creates such distortion uses uniform sampling.

An alternative approach to uniform sampling that reduces distortion is referred to as natural sampling. Natural sampling refers to a theoretically ideal technique to convert PCM to PWM signals. One prior method has approximated natural sampling by performing iterative $3^{rd}$ order polynomial curve fitting and root solving. While the above method is potentially quite useful, this method has not been widely used commercially since the computing operations to implement the method typically require a large amount of processing time.

Accordingly, there is a need for an improved method and apparatus for converting a digital PCM data stream into a PWM signal.

DETAILED DESCRIPTION

Generally, the present invention provides an apparatus and a method to convert pulse code modulated (PCM) data to a pulse width modulated signal. In one embodiment, a crossing point of an analog signal with the ramp portion of a sawtooth waveform is approximated by first extrapolating, or projecting a line between two adjacent sample points across other sample points to produce an estimate of the crossing point. A magnitude difference between a crossing point of the extrapolated line and a sample point magnitude on each side of the crossing point is determined. The magnitude difference, multiplied by an empirically determined constant, is added to the estimate. The value of the constant depends at least partly on the sample frequency. Natural PWM can be efficiently approximated using this method with fewer computations and with resolution comparable to known methods.

Figure 1:
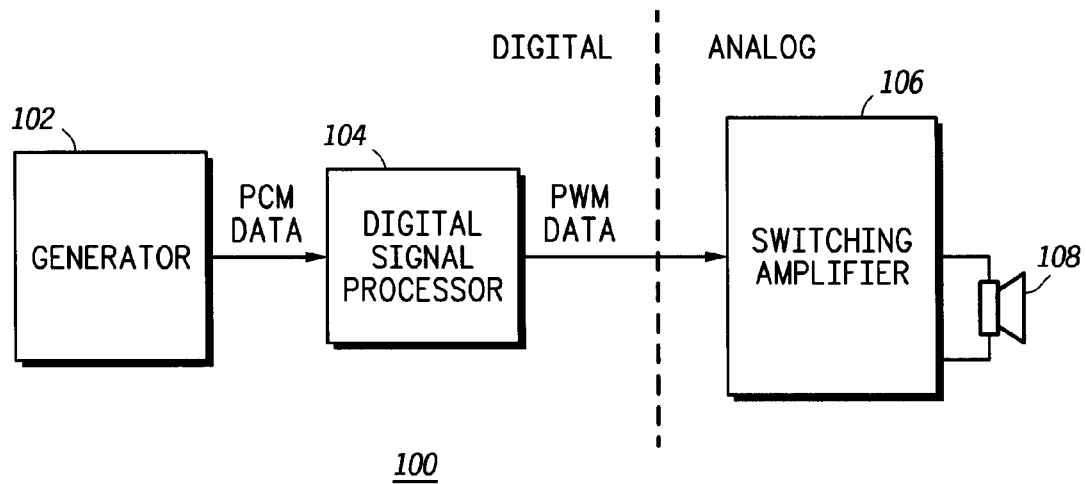
FIG. 1 is a block diagram of a pulse width modulation conversion system in accordance with an embodiment of the present invention.

FIG. 1 illustrates a block diagram of a pulse width modulation (PWM) conversion system 100 in accordance with an embodiment of the present invention. Pulse width modulation conversion system 100 includes pulse code modulation (PCM) generator 102, digital signal processor (DSP) 104, switching amplifier 106, and a speaker 108. PCM generator 102 has an output for providing pulse code modulated data signals labeled "PCM DATA". DSP 104 has an input for receiving data signals PCM DATA, and an output for providing data signals labeled "PWM DATA". Switching amplifier 106 has an input for receiving data signals PWM DATA, and an output coupled to speaker 108.

In operation, PCM generator 102 provides a digital data stream of data, such as audio PCM data. PCM generator 102 can be any source of PCM digital data, such as for example, a compact disk (CD) player. DSP 104 converts the PCM data to digital PWM data. The PWM data is used to drive switching amplifier 106. In the illustrated embodiment, switching amplifier 106 can be characterized as a class D amplifier. A class D amplifier is used because it allows a digital path nearly all the way to speaker 108, which eliminates the need for a digital-to-analog converter and linear amplifier. Also, class D amplifiers are more efficient than a standard linear power amplifier, allowing for reduced power consumption and thermal dissipation.

Generally, data signals PCM DATA are uniformly sampled, and PWM data signals are approximately naturally sampled. DSP 104 is used to efficiently digitally approximate natural PWM sampling based on the uniformly sampled PCM data signals.

Figure 2:
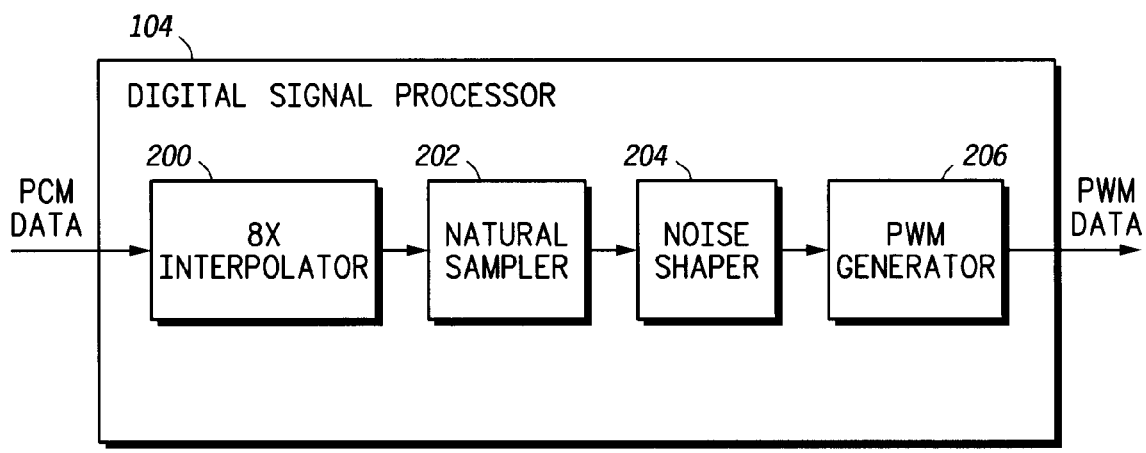
FIG. 2 is a block diagram that illustrates the digital signal processor of FIG. 1 in more detail.

FIG. 2 illustrates the DSP 104 of FIG. 1 in more detail. DSP 104 includes interpolator 200, sampler 202, noise shaper 204, and PWM generator 206. Interpolator 200 has an input for receiving and interpolating the PCM DATA, and an output for providing an upsampled pulse code modulated data stream. In the illustrated embodiment, interpolator 200 is an 8X interpolator. Sampler 202 has an input coupled to the output of interpolator 200, and an output. Sampler 202 executes an algorithm to approximate natural sampling as used in PWM. For a set of samples of the upsampled pulse code modulated data stream, sampler 202 converts the upsampled pulse code modulated data stream to digital PWM data. Briefly, this is accomplished by establishing an additional data point having a sample time between two adjacent samples of the set of samples, and using at least one magnitude difference value relative to at least one sample of the set of samples other than the two adjacent samples. Examples of particular algorithms is described below in more detail with reference to FIGS. 3 and 4.

Noise shaper 204 has an input coupled to the output of sampler 202, and an output for providing filtered PWM data. In the illustrated embodiment, noise shaper 204 is a filter, such as a $4^{th}$ order digital sigma-delta modulator, and the filtered PWM data has a reduced bit width compared to the PWM data. For example, PWM data may be sixteen bits and the sigma-delta modulator output may have a bit width of eight. PWM generator 206 has an input coupled to the output of noise shaper 204, and an output for providing data signals PWM DATA. Note that in the illustrated embodiment, the algorithms are implemented in software to be run on a DSP. However, in other embodiments, the algorithms may be implemented in software, hardware, or a combination of software and hardware and may be run on any type of data processing system. Also, the software may be embedded on a data processing system integrated circuit (such as a DSP), or stored in memory external to the data processing system integrated circuit.

Figure 3:
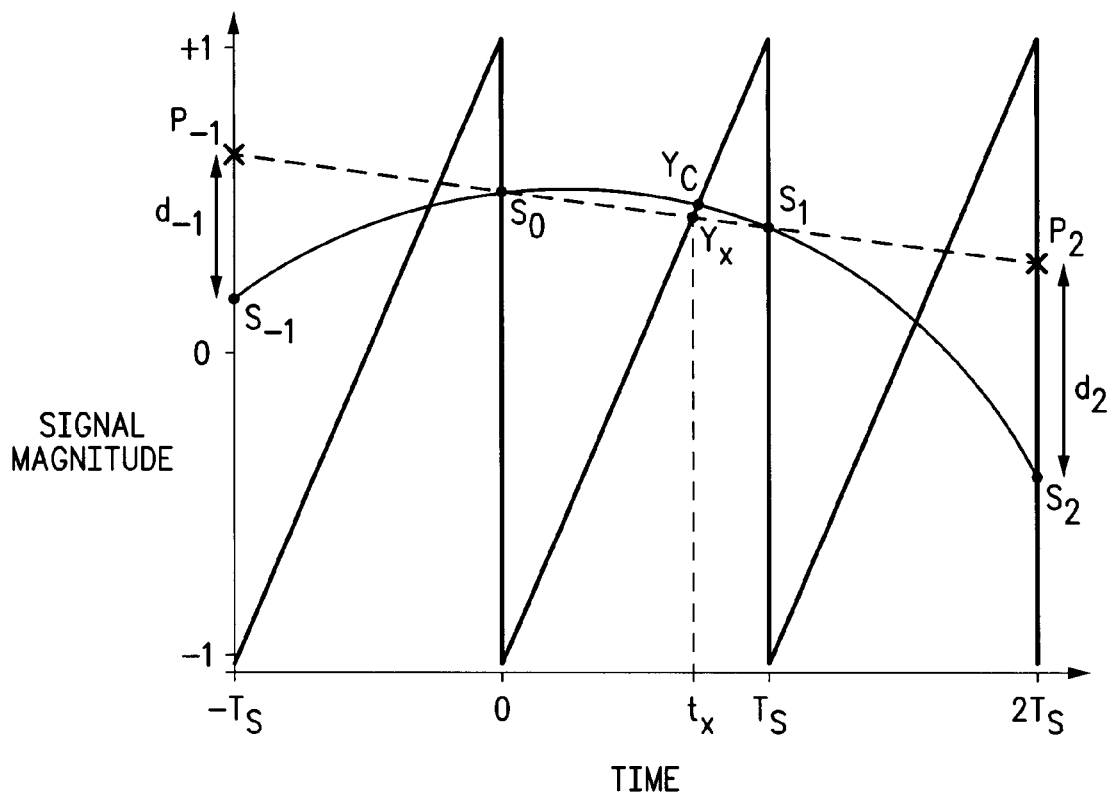
FIG. 3 illustrates a waveform of signal magnitude versus time in accordance with one method for approximating natural sampling.

FIG. 3 illustrates a waveform of signal magnitude versus time in accordance with one method for approximating natural sampling in PWM conversion system 100. In FIG. 3, data points labeled $S_{-1}$, $S_0$, $S_1$, and $S_2$ correspond to adjacent data samples in a digital audio PCM data stream. The y-axis indicates signal magnitude and the x-axis indicates time. For uniformly sampled data the time between adjacent samples is given by $T_S$. The sampled input signal magnitude is normalized to lie between 1 and −1. The smooth curve connecting the data sample magnitudes represents an ideal recovered analog signal. Also shown is the sawtooth comparison waveform used to generate the PWM signal. For natural sampled PWM, the width of the PWM pulse is determined by the magnitude $Y_c$ of the sawtooth ramp at the point it crosses, or intersects with, the ideal recovered analog signal. The exemplary illustrated methods described efficiently approximate the value for $Y_c$. The first method requires fewer computations per sample (of the incoming data stream) than the second method, but at the cost of reduced accuracy as compared to the second method.

In the first method, a line is first linearly extrapolated, or projected, between two adjacent samples, for example $S_0$ and $S_1$. The linearly extrapolated line is illustrated in FIG. 3 by a dashed line through $S_0$ and $S_1$ and extended across times $-T_s$ and $2T_s$. An initial estimate for $Y_c$ is determined by calculating the point $Y_x$ at time $t_x$, where the sawtooth ramp crosses, or intersects with, the extrapolated line between the two adjacent samples. The time at $S_0$ is considered reference time 0. The magnitude of the extrapolated line at point $P_{-1}$ where it crosses time $-T_s$ is compared to the data sample, $S_{-1}$ to find magnitude difference $d_{-1}$, where $d_{-1}=P_{-1}-S_{-1}$. Similarly, the magnitude of the extrapolated line at $2T_s$, $P_2$ is compared to data sample $S_2$ to find magnitude difference $d_2$, where $d_2=P_2-S_2$.

The magnitude difference value indicates a curvature estimate of the analog signal corresponding to the upsampled pulse code modulated data stream. As $d_{-1}$ and/or $d_2$ become large it can be seen that the difference $Y_c-Y_x$ will increase. Likewise, as $d_{-1}$ and/or $d_2$ become small, $Y_c-Y_x$ will decrease. The bending of the curve inside the interval $[0, T_s]$ due to $d_{-1}$ and/or $d_2$, will be zero at time 0 and at time $T_s$, and approximately maximum at time $T_s/2$.

The following algorithm approximates the shape of the bending inside the interval $[0, T_s]$ using a sine function:

$$Y_c = Y_x + \alpha(d_{-1}+d_2)\sin(t_x\pi/T_s) \quad \text{Algorithm 1}$$

Notice that $d_{-1}$ and $d_2$ are the same distance away from the center of the interval $[0, T_s]$, and this is why their relative weights in Algorithm 1 are the same.

In Algorithm 1 above, $\alpha$ is a constant that can be determined empirically. Fortunately, using Algorithm 1 with tone frequencies ranging from 20 Hz to 20 kHz at sampling frequencies of 352.8 kHz or higher, it has been observed that the optimum value for $\alpha$ has negligible dependence on the tone frequency. It does depend, however, on the sampling frequency, which means that identical algorithms working at different sampling frequencies will have to use different values for $\alpha$.

Algorithm 1 can be implemented for approximating $Y_c$ in DSP 104 of FIGS. 1 and 2. Starting with the system constants for ramp slope rs, sample period $T_s$, and the optimum value for a at that sampling frequency, the following remaining constants can be initially calculated:

$$c1 = rs * T_s$$

$$c2 = c1/2$$

$$c3 = \pi/2$$

The following calculations are then performed per each sample period:

$$a1 = c1 + S_0$$

$$a2 = a1 - S_1$$

$$a3 = S_0 + S_1$$

$$a4 = -S_{-1} + a3 - S_2$$

$$Y_x = c2*a3/a2$$

$$Y_c = Y_x + \alpha*a4*\sin(c3*(a1+S_0)/a2)$$

Depending on the processor's capabilities an expansion for the sine function can be used in place of the sine function. Also, any other curvature adjusting mapping function can be used in place of the above sine function, such as for example, $1-x^2$.

Figure 4:
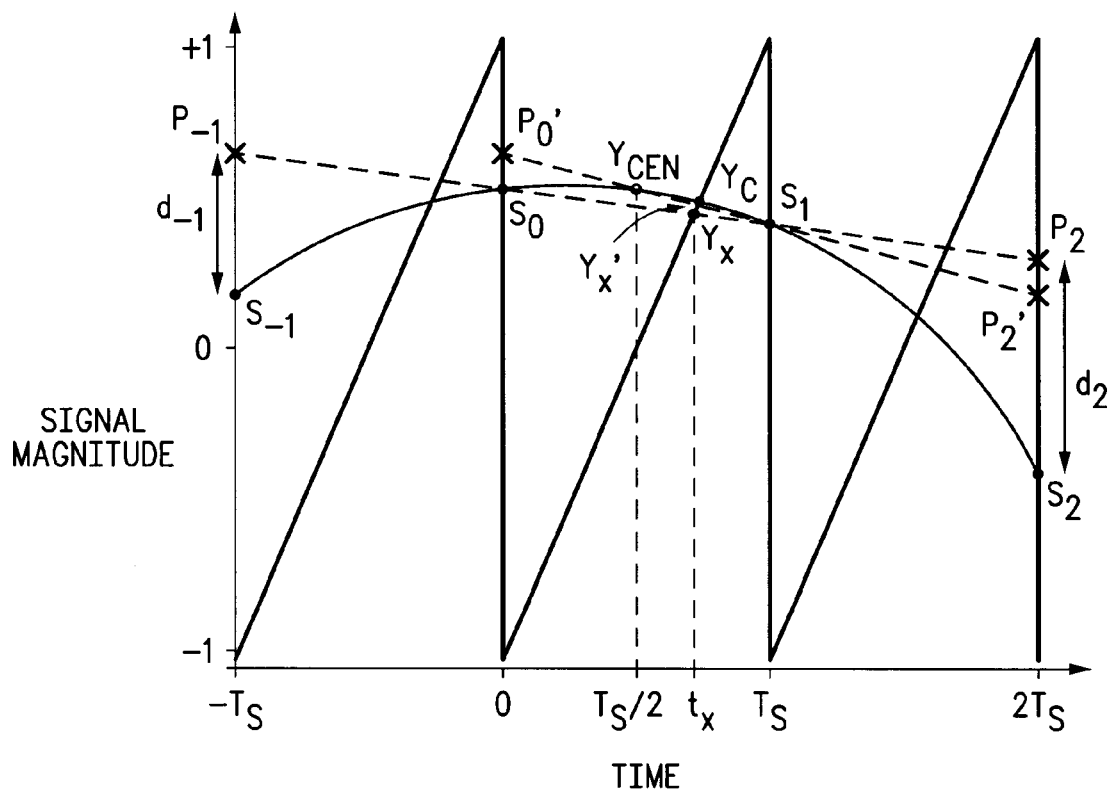
FIG. 4 illustrates a waveform of signal magnitude versus time in accordance with another method for approximating natural sampling.

FIG. 4 illustrates a waveform of signal magnitude versus time in accordance with a second method for approximating natural sampling. In FIG. 4, data points labeled $S_{-1}$, $S_0$, $S_1$, and $S_2$ correspond to adjacent data samples in a digital audio data stream. The y-axis indicates signal magnitude and the x-axis indicates time. For uniformly sampled data the time between adjacent samples is given by $T_s$. The sampled input signal magnitude is normalized to lie between 1 and −1. The smooth curve connecting the data sample magnitudes represents an ideal recovered analog signal. Also shown is the sawtooth comparison waveform used to generate the PWM signal.

In the second method, an extrapolated line between two adjacent samples, for example $S_0$ and $S_1$, is first calculated and illustrated in FIG. 4 by a dashed line. A point labeled $Y_{cen}$ is a theoretical sample point at time $T_s/2$. An approximation for $Y_{cen}$ is determined by the following:

$$Y_{cen} = (S_0+S_1)/2 + \beta(d_{-1}+d_2)$$

The optimum value for $\beta$ is determined empirically. The sign of $Y_{cen}$ is used to determine which half of the interval the ramp waveform will cross the signal waveform. If $Y_{cen}$ is positive then a line is fit between $Y_{cen}$ and $S_1$. If $Y_{cen}$ is negative then a line is fit between $S_0$ and $Y_{cen}$. For the example shown in FIG. 4, $Y_{cen}$ is positive and a line is fit between $Y_{cen}$ and $S_1$. An initial estimate for $Y_c$ is determined by calculating the point $(t_x', Y_x')$ where the sawtooth ramp crosses this line. Similar to the first method, the magnitude of this interpolated line at time 0, $P_0'$, is compared to the data sample $S_0$:

$$d_0' = P_0' - S_0$$

Likewise, the magnitude of the extrapolated line at $2T_s$, $P_2'$, is compared to the data sample $S_2$:

$$d_2' = P_2' - S_2$$

The following equation is then used to calculate the approximate value for $Y_c$ when $Y_{cen}$ is positive, or greater than or equal to zero:

$$Y_c = Y_x' + \alpha(d_0' + \gamma d_2')\cos((t_x' - (3T_s/4))(\pi/2)/(T_s/4)) \quad \text{Algorithm 2}$$

($Y_{cen}$ positive)

where the optimum values for $\alpha$ and $\gamma$ are determined empirically. Notice that now the two differences $d_0'$ and $d_2'$ are not symmetrically located with respect to the center of the interval $[T_s/2, T_s]$ (the one the cosine is applied to), and that is why a coefficient is needed to give them different weights.

If $Y_{cen}$ had been less than zero, or negative, the following expression should have been used:

$$Y_c = Y_x' + \alpha(\gamma d_{-1}' + d_1')\cos((t_x' - (T_s/4))(\pi 2)/(T_s/4)) \quad \text{Algorithm 2}$$

($Y_{cen}$ negative)

The second method, as embodied in algorithm 2, can be implemented in DSP 104 for approximating $Y_c$. Starting with the system constants for ramp slope rs, sample period $T_s$, and empirically determined constants $\alpha, \beta$, and $\gamma$, the following remaining constants can be initially calculated:

$$c1 = 2/T_s$$

$$c2 = \pi c1$$

$$c3 = T_s/4$$

The following calculations are then performed each sample period:

$$a1 = S_0 + S_1$$

$$a2 = -S_{-1} + a1 - S_2$$

$$Y_{cen} = a1/2 + \beta a2$$

$$a3 = 2 Y_{cen}$$

If $Y_{cen} \geq 0$ $$\text{slopecen1} = c1 \, (S_1 - Y_{cen})$$

$$\Delta t' = Y_{cen}/(rs - \text{slopecen1})$$

[Note: division operation may be implemented as polynomial estimate to reduce processor time]

$$Y_x' = \Delta t' rs$$

$$d_0' = a3 - a1$$

$$d_2' = 3S_1 - a3 - S_2$$

$$Y_c = Y_x' + \alpha(d' + \gamma d_2')\cos(c2 \, (\Delta t' - c3))$$

If $Y_{cen} < 0$ $$\text{slope0cen} = c1 \, (Y_{cen} - S_0)$$

$$\Delta t' = Y_{cen}/(rs - \text{slope0cen})$$

[Note: division operation may be implemented polynomial estimate to reduce processor time]

$$Y_x' = \Delta t' rs$$

$$d_{-1}' = 3S_0 - a3 - S_{-1}$$

$$d_1' = a3 - a1$$

$$Y_c = Y_x' + \alpha(\gamma d_{-1}' + d_1')\cos(c2 \, (\Delta t' + c3))$$

Depending on the processor's capabilities, a function other than a cosine function can be used for curvature adjusting. For example, the cosine function for the above implementation of Algorithm 2 can be replaced with the following curvature adjusting mapping functions:

For $Y_{cen} \geq 0$ replace the cosine function with $1 - (16/T_s^2)(\Delta t' - T_s/4)^2$ For $Y_{cen} < 0$ replace the cosine function with $1 - (16/T_s^2)(\Delta t' + T_s/4)^2$ Note that one skilled in the art will recognize that both methods can be easily modified to accommodate two-sided pulse width modulation. In a two-sided embodiment, the sawtooth slope rs will have alternate signs for consecutive samples. Also, instead of checking the sign of $Y_{cen}$, the sign of ($Y_{cen}$*rs) will be checked. This comparison can still be implemented without requiring additional floating point operations.

Figure 5:
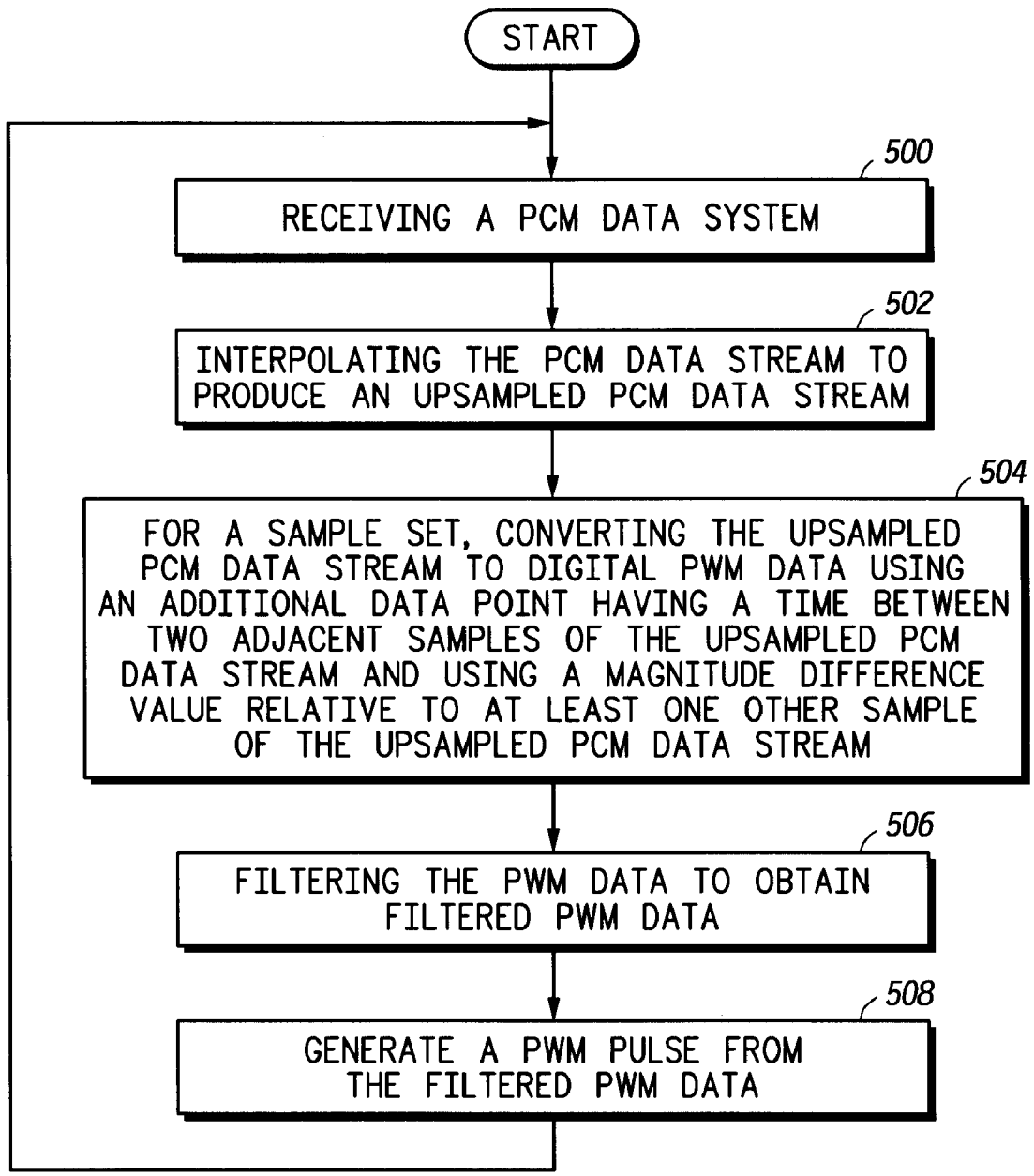
FIG. 5 is a flow chart that illustrates a method for approximating natural sampling.

FIG. 5 is a flow chart that illustrates a method of converting a PCM data stream to a PWM signal. A PCM data stream is received, at 500. The PCM data stream is interpolated to produce an upsampled PCM data stream, at 502. In a particular embodiment, the PCM data stream has a frequency of 44.1 kHz and the upsampled PCM data stream has been interpolated eight times to have a frequency of 352.8 kHz. For each set of samples of the upsampled PCM data stream, an additional data point between two adjacent samples is produced, at 504. In one embodiment, the additional data point is determined by using a magnitude difference value relative to at least one sample data point in the set of samples.

For example, in reference to FIG. 3, the additional data point is identified as $Y_c$ and the magnitude difference value is $d_{-1}$ which is a magnitude difference relative to sample $S_{-1}$. As described with respect to FIG. 3, the additional data point $Y_c$ is determined based on the difference values, such as $d_{-1}$ and $d_2$. The magnitude difference value $d_{-1}$ is indicative of the curvature of an analog signal corresponding to the upsampled PCM data stream at or about sample point $S_0$. In addition, in a particular embodiment, the additional data point $Y_c$ is advantageously determined without performing a complex polynomial equation root-finding operation, thereby leading to a reduced processor time implementation. The curvature indicator, e.g. $d_{-1}$ is determined using a linear operation. As a particular example, $d_{-1}$ may be determined by taking $P_{-1} - S_{-1}$.

Similarly, $d_2$ may be determined by performing the linear magnitude difference calculation $P_2 - S_2$. Thus, valuable curvature information may be determined efficiently using processing efficient linear operations.

Referring back to FIG. 5, PWM data is filtered to obtain filtered PWM data, at 506, and a PWM pulse signal is produced from the filtered PWM data, at 508. In a particular illustrative embodiment, the filtered PWM data has a reduced bit length. The above method steps 500–508 are then repeated for additional sample sets of the upsampled PCM data stream.

While certain aspects of the invention have been described in the context of particular illustrative embodiments, it will be apparent to those skilled in the art that the present invention may assume many embodiments other than those specifically set out and described above. Accordingly, it is intended by the appended claims, and their equivalents to cover all modifications of the particular illustrative embodiments disclosed above which fall within the true scope of the invention.

What is claimed is:

1. A method of converting a pulse code modulated data stream to produce a pulse width modulated signal, the method comprising:

receiving the pulse code modulated data stream;

interpolating the pulse code modulated data stream to produce an upsampled pulse code modulated data stream;

for a set of samples of the upsampled pulse code modulated data stream, converting the upsampled pulse code modulated data stream to digital pulse width modulated data including a data point having a sample time between two adjacent samples of the set of samples, the data point determined based on at least one magnitude difference value relative to at least one sample of the set of samples other than the two adjacent samples, wherein the magnitude difference value is a difference in signal magnitude between the at least one sample and a linearly extrapolated data point based on the two adjacent samples; and producing the pulse width modulated signal in response to the digital pulse width modulated data.

2. The method of claim 1, further comprising filtering the pulse width modulated data to obtain filtered pulse width modulated data.

3. The method of claim 2, wherein the pulse width modulated signal is produced in response to the filtered pulse width modulated data.

4. The method of claim 2, wherein the filtered pulse width modulated data has a shorter bit length than the pulse width modulated data.

5. The method of claim 2, wherein filtering the pulse width modulated data comprises a noise shaping operation.

6. The method of claim 1, wherein the magnitude difference value indicates a curvature of an analog signal corresponding to the upsampled pulse code modulated data stream.

7. The method of claim 1, further comprising determining a second data point having a sample time between the two adjacent samples of the set of samples.

8. The method of claim 1, further comprising determining the data point using a plurality of magnitude difference operations relative to a plurality of samples other than the two adjacent samples.

9. An apparatus for converting a pulse code modulated data stream to a pulse width modulated signal, the apparatus comprising:

an interpolator to receive the pulse code modulated data stream and to produce an upsampled pulse code modulated data stream;

an approximating natural sampling module to, for asset of samples of the upsampled pulse code modulated data stream, convert the upsampled pulse code modulated data stream to digital pulse width modulated data using an additional data point having a sample time between two adjacent samples of the set of samples, the additional data point computed based on at least one signal magnitude difference value relative to at least one sample of the set of samples other than the two adjacent samples, wherein the magnitude difference value is a difference in signal magnitude between the at least one sample and a linearly extrapolated data point based on the two adjacent samples; and a pulse width modulation generator to produce the pulse width modulated signal in response to the digital pulse width modulated data.

10. The apparatus of claim 9, wherein the interpolator, the approximating natural sampling module and the pulse width modulation generator are embedded within a digital signal processor.

11. The apparatus of claim 9, further comprising a switching amplifier responsive to the pulse width modulated signal.

12. The apparatus of claim 9, further comprising a noise shaping filter responsive to the approximating natural sampling module, to filter the digital pulse width modulated data.

13. The apparatus of claim 12, wherein the filter reduces bit length of the digital pulse width modulated data.

14. A method of producing a pulse width modulated signal, the method comprising:

receiving a pulse code modulated data stream;

for a set of samples of the pulse code modulated data stream, converting the pulse code modulated data stream to digital pulse width modulated data having at least one data point computed based on a value that indicates a curvature of an analog signal corresponding to the pulse code modulated data stream, the value determined without performing a polynomial equation root-finding operation, wherein the value is a difference in signal magnitude between the at least one sample and a linearly extrapolated data point based on the two adjacent samples; and producing the pulse width modulated signal in response to the digital pulse width modulated data.

15. The method of claim 14, further comprising determining an initial estimate of the data point by determining an intersection between a ramp function and a line segment between two adjacent samples of the set of samples.

16. The method of claim 14, wherein the value is determined based on a plurality of magnitude difference operations relative to a plurality of samples other than the two adjacent samples.

17. The method of claim 14, further comprising determining a second data point having a sample time between the two adjacent samples of the set of samples.

18. A method of converting a pulse code modulated data stream to produce a pulse width modulated signal, the method comprising:

interpolating the pulse code modulated data stream to produce an upsampled pulse code modulated data stream;

for a set of samples of the upsampled pulse code modulated data stream, converting the upsampled pulse code modulated data stream to digital pulse width modulated data having a computed data point with a sample time between two adjacent samples of the set of samples, the data point determined based on a value that indicates a curvature of an analog signal corresponding to the upsampled pulse code modulated data stream, the value determined using a linear operation;

determining a second data point having a sample time between the two adjacent samples of the set of samples;

producing the pulse width modulated signal in response to the digital pulse width modulated data.

19. A method of converting a pulse code modulated data stream to produce a pulse width modulated signal, the method comprising:

interpolating the pulse code modulated data stream to produce an upsampled pulse code modulated data stream;

for a set of samples of the upsampled pulse code modulated data stream, converting the upsampled pulse code modulated data stream to digital pulse width modulated data having a computed data point with a sample time between two adjacent samples of the set of samples, the data point determined based on a value that indicates a curvature of an analog signal corresponding to the upsampled pulse code modulated data stream, the value determined using a linear operation, wherein the value is derived based on a first curvature estimate at a first sample of the set of samples and a second curvature estimate at a second sample of the set of samples; and producing the pulse width modulated signal in response to the digital pulse width modulated data.

20. The method of claim 19, further comprising taking an average of the first and second curvature estimates.

21. A method of converting a pulse code modulated data stream to produce a pulse width modulated signal, the method comprising:

interpolating the pulse code modulated data stream to produce an upsampled pulse code modulated data stream;

for a set of samples of the upsampled pulse code modulated data stream, converting the upsampled pulse code modulated data stream to digital pulse width modulated data having a computed data point with a sample time between two adjacent samples of the set of samples, the data point determined based on a value that indicates a curvature of an analog signal corresponding to the upsampled pulse code modulated data stream, the value determined using a linear operation;

adjusting the value using a curvature adjusting mapping function; and producing the pulse width modulated signal in response to the digital pulse width modulated data.

22. The method of claim 21, wherein the curvature adjusting mapping function is selected from a group consisting of cosine, sine, and $1-x^2$.

* * * * *

UNITED STATES PATENT AND TRADEMARK OFFICE
CERTIFICATE OF CORRECTION

PATENT NO. : 6,473,457 B1
DATED : October 29, 2002
INVENTOR(S) : Cesar Pascual et al.

It is certified that error appears in the above-identified patent and that said Letters Patent is hereby corrected as shown below:

<u>Column 7,</u>
Line 48, change "asset" to -- a set --.

Signed and Sealed this

Tenth Day of June, 2003

JAMES E. ROGAN
*Director of the United States Patent and Trademark Office*